US006410940B1

(12) United States Patent
Jiang et al.

(10) Patent No.: US 6,410,940 B1
(45) Date of Patent: Jun. 25, 2002

(54) MICRO-SIZE LED AND DETECTOR ARRAYS FOR MINIDISPLAY, HYPER-BRIGHT LIGHT EMITTING DIODES, LIGHTING, AND UV DETECTOR AND IMAGING SENSOR APPLICATIONS

(75) Inventors: Hongxing Jiang; Jingyu Lin; Sixuan Jin; Jing Li, all of Manhattan, KS (US)

(73) Assignee: Kansas State University Research Foundation, Manhattan, KS (US)

( * ) Notice: Subject to any disclaimer, the term of this patent is extended or adjusted under 35 U.S.C. 154(b) by 0 days.

(21) Appl. No.: 09/594,960

(22) Filed: Jun. 15, 2000

(51) Int. Cl.⁷ .............................................. H01L 27/15
(52) U.S. Cl. ............................ 257/82; 257/79; 257/80; 257/81; 257/88; 438/22; 438/24; 438/46; 438/47
(58) Field of Search ..................... 257/88, 13, 79–82, 257/93, 94, 96; 438/13, 22, 24, 46, 47, 956

(56) References Cited

U.S. PATENT DOCUMENTS

| | | | | |
|---|---|---|---|---|
| 5,317,170 A | * | 5/1994 | Paoli ............................ | 257/88 |
| 5,563,422 A | * | 10/1996 | Nakamura et al. ............. | 257/13 |
| 5,652,434 A | | 7/1997 | Nakamura et al. ............. | 257/13 |
| 5,767,581 A | | 6/1998 | Nakamura et al. ........... | 257/749 |
| 5,877,558 A | | 3/1999 | Nakamura et al. ........... | 257/749 |
| 5,952,680 A | * | 9/1999 | Strite ........................... | 257/88 |
| 5,955,748 A | * | 9/1999 | Nakamura et al. ............. | 257/88 |
| 5,966,393 A | * | 10/1999 | Hide et al. ..................... | 372/23 |
| 6,054,724 A | * | 4/2000 | Ogihara et al. ................ | 257/88 |
| 6,093,965 A | | 7/2000 | Nakamura et al. .......... | 257/749 |

OTHER PUBLICATIONS

S X Jin, J Li, J Y Lin and H X Jiang, Appl. Phys. Lett. 77 p.3236 (2000).*
Mair et al., Optical properties of GaN/AlGaN multiple quantum well microdisks, Nov. 17, 1997, Appl. Phys, Lett. 76 (5) p. 631, American Institute of Physics.*

* cited by examiner

*Primary Examiner*—Nathan Flynn
*Assistant Examiner*—Scott R Wilson
(74) *Attorney, Agent, or Firm*—Jennifer L. Bales; Macheledt Bales LLP

(57) ABSTRACT

A micro-size LED-like optical element has an n-contact, a p-contact, and an optical active structure connected between the n-contact and the p-contact for generating light when forward biased and for detecting light when reverse biased. The optical active structure has a diameter of about 20 $\mu$m or smaller. When the the optical active structure is forward biased, it forms a micro-size LED ($\mu$LED). When the optical active structure is reverse biased, it forms a micro-size detector ($\mu$detector). An array of the micro-size optical active structures may be used as a minidisplay, a detector, or a sensor (when each structure is separately wired), or as a hyperbright LED (when the structures are wired to turn on and off simultaneously). Alternatively, a hyperbright LED may be obtained by forming a plurality of micro-size holes extending into an LED wafer.

13 Claims, 9 Drawing Sheets

MICRO-SIZE LED AND DETECTOR ARRAYS FOR MINIDISPLAY, HYPER-BRIGHT LIGHT EMITTING DIODES, LIGHTING, AND UV DETECTOR AND IMAGING SENSOR APPLICATIONS

BACKGROUND OF THE INVENTION

1. Field of the Invention

The present invention relates to micro-size light emitting diodes (LEDs) and detectors and their arrays for minidisplay, UV detector arrays, imaging sensors, and hyper-bright LEDs and lighting applications.

2. Description of the Prior Art

Currently, most conventional broad area LEDs operating in the wavelength region from 530–800 nm are based on the older GaP/GaAs technologies. However, GaP/GaAs based LEDs are not especially bright below 600 nm and their emission wavelengths are too long to excite phosphors for down-conversion to make white light. Current commercially available broad area LEDs based on a new class of semiconductor materials (i.e. III-nitrides) can operate in the spectral region from green, blue to violet. The III-nitride technology may eventually be extended into the red covering the entire visible spectrum. To date, most III-nitride based LEDs are fabricated from quantum well and heterostructures of InGaN/GaN, $In_xGa_{1-x}N/In_{x'}Ga_{1-x'}N$ (x not equal to x'), and GaN/AlGaN. Blue-green LEDs and laser diodes use InGaN as an active medium, by taking advantage of heterojunctions and quantum wells (QW), and the tunability of the band gap in the alloys from InN (1.9 eV, 652 nm) to GaN (3.4 eV, 365 nm).

The conventional LED sizes are typically larger than 200 μm by 200 μm (300 μm by 300 μm for III-nitride LEDs in particular). The efficiencies of these conventional broad area LEDs can be further improved. Moreover, these conventional broad area LEDs are not suited to minidisplays.

A need remains in the art for micro-size light emitting diodes (LEDs) for minidisplay, hyper-bright LED, and lighting applications. A need also remains in the art for micro-size detectors for use in detector arrays and imaging sensors with high spatial resolutions and UV sensitivities.

SUMMARY OF THE INVENTION

One object of the present invention is to provide micro-size light emitting diodes (μLEDs) and μLED arrays for hyper-bright LED and lighting applications, and for minidisplays. Another object is to provide micro-size detector arrays for use in high spatial resolution detector arrays and imaging sensors.

A conventional broad area LED is replaced with many micro-size LEDs (μLEDs) connected in a manner that they are turned on and off simultaneously for hyper-bright LED and lighting applications. For example, an array of many of these μLEDs fits into the same area taken up by a conventional broad area LED. The output power of these μLEDs are enhanced over the conventional broad area LEDs. The enhanced quantum efficiency in μLEDs is due to the increased light extraction efficiencies. Additionally, an enhanced quantum efficiency in μLEDs is also an inherent attribute due to micro-size effects as well as a more efficient usage of injected current. Furthermore, strain induced by lattice mismatch between the well and barrier materials (e.g., InGaN and GaN) is partially relieved as the lateral size of the LEDs decreases, which tends to increase the radiative recombination efficiencies in μLEDs. Therefore, replacing a conventional broad-area LED with a micro-size LED array can enhance the total light output for a fixed luminous area.

Many micro-size holes (regular or irregular shapes) drilled into a conventional broad area LED (termed as inverted μLEDs hereafter) are also employed to increase the extraction efficiencies of the LEDs.

Many μLEDs are connected in a manner that they are addressed individually for minidisplay applications. When these micro-size arrays are reverse biased, they form detector arrays as imaging sensors with high spatial resolutions. Hereafter, the reverse biased micro-sized structures (which are μLEDs when forward biased) are termed μdetectors.

The present invention for improving the brightness of LEDs is applicable to semiconductor LEDs, polymer LEDs, as well as others such as organic LEDs. III-nitrides will be used as a specific example throughout the text. For devices based on III-nitrides, III-nitride quantum wells (QWs) or heterostructures are employed as an active media. Such active media include QW and heterostructures of InGaN/GaN, $In_xGa_{1-x}N/In_{x'}Ga_{1-x'}N$ (x not equal to x'), GaN/AlGaN, $Al_xGa_{1-x}N/Al_{x'}Ga_{1-x'}N$, and lattice matched QWs and heterostructures such as $In_xAl_yGa_{1-x-y}N/In_{x'}Al_{y'}Ga_{1-x'-y'}N$ (x not equal to x', y not equal to y') and $GaN/In_xAl_yGa_{1-x-y}N$. Enhanced efficiency in the UV region will be very important for the realization of commercially viable white LEDs that currently utilize UV light excitation of phosphor materials for down-conversion to make white light. In particular, ultraviolet (UV) LEDs based on III-nitrides is currently used to generate white light by coating the chips with phosphors. Phosphors down-convert part of the shorter wavelength UV light to a longer wavelength visible light. Through color mixing, the eye sees white when two colors are properly balanced. In such an application area, the generation of highly efficient UV photons based on the present invention is particularly beneficial.

Minidisplays and imaging sensors based on III-nitrides according to the present invention could be especially useful for full color minidisplays, UV/solar blind detection, medical imaging, etc.

DETAILED DESCRIPTION OF THE PREFERRED EMBODIMENT

Figure 1A:
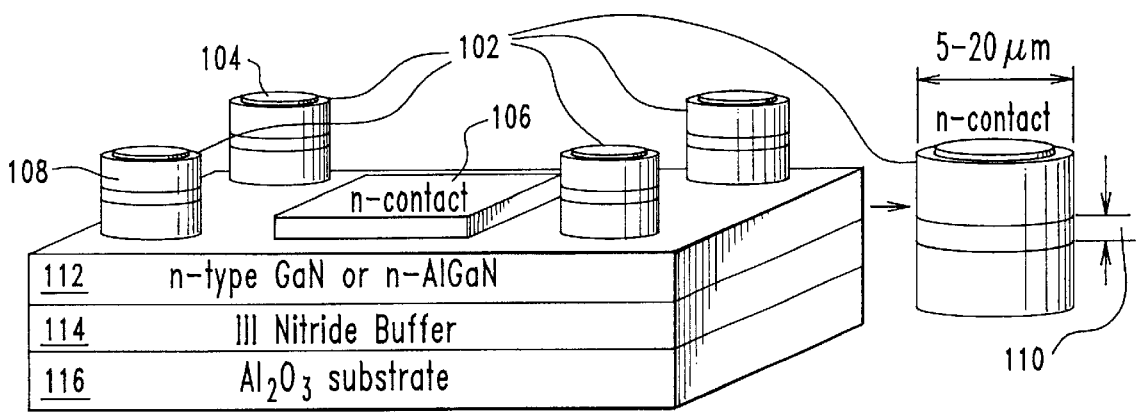
FIG. 1(a) is a side perspective showing the structure of a first embodiment of several III-nitride micro-size LEDs (μLEDs) or 5 micro-sized detectors (μdetectors) according to the present invention.

FIG. 1(a) is a side perspective showing the structure of several III-nitride micro-size LEDs (μLEDs) or micro-size detectors (μdetectors) 102 according to a first embodiment of the present invention. Note that whether structures 102 comprise μLEDs or μdetectors depends upon how the structures are biased: forward biased structures 102 comprise μLEDs, and reverse biased structures 102 are light detectors, here called μdetectors. Each μLED/μdetector is approximately 5–20 μm in diameter. The optical active media are inside structures 102, and no optical active media is present between structures 102. Photolithography and dry etching/or chemical wet etching is used to pattern arrays of structures 102 of desired diameters and spacings. The LED wafers are etched into the underneath n-type layer so that no active optical media material is present between structures 102.

As an illustration, a III-nitride semiconductor LED wafer may comprise a III-nitride buffer layer 114 formed on an $Al_2O_3$ or Si or SiC substrate 116. An n-type GaN epilayer 112 is formed on the buffer layer 114. A multiple quantum wells (MQWs) structure 110 comprising alternating layers of $In_xGa_{1-x}N$ and GaN; $In_xGa_{1-x}N$ and $In_{x'}Ga_{1-x'}N$ (x is not equal to x'); $In_xGa_{1-x}N$ and $In_xAl_yGa_{1-x-y}N$ or a single epitaxial layer of $In_xGa_{1-x}N$ is formed next as optical active media, followed by a p-type layer 108 of $In_xAl_yGa_{1-x-y}N$ or GaN or AlGaN. Those skilled in the art will appreciate other layer structures based on the same principle, such as adding more III-nitride layers to the structures.

N-type Ohmic contact 106 is then deposited on the underneath exposed n-type layer 112 (this is necessary when the substrate is insulating) and p-type Ohmic contact 104 is formed on the top p-type layer 108.

Figure 1B:
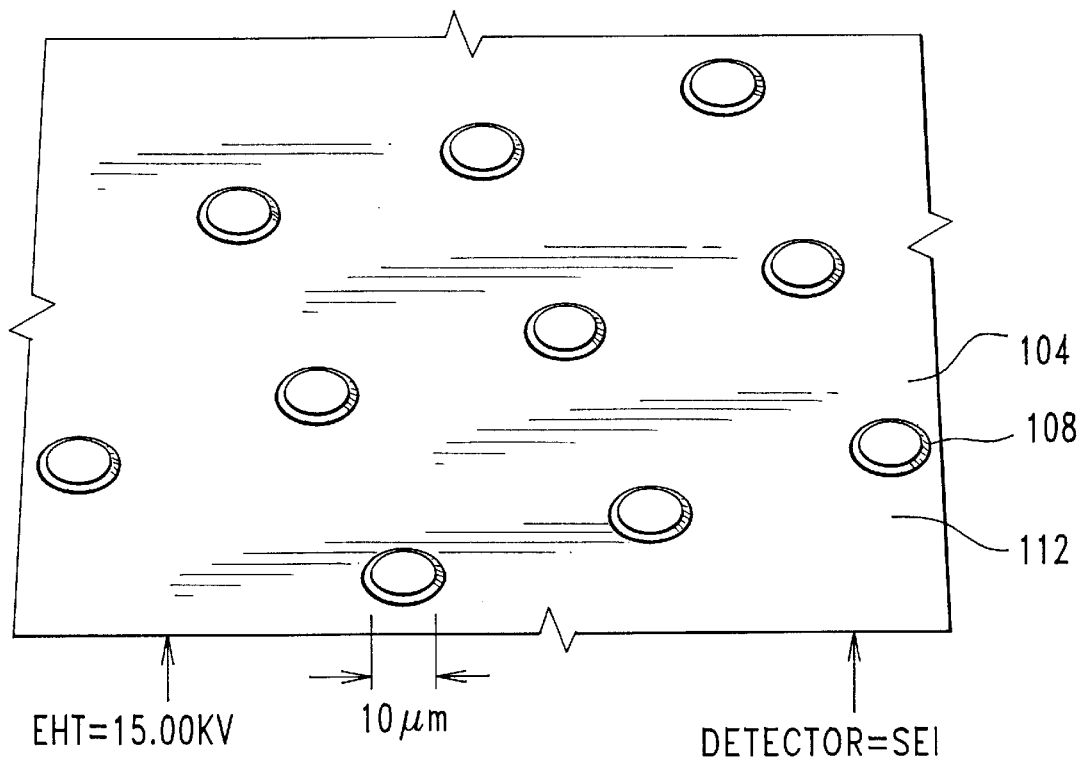
FIG. 1(b) is a top view of a fabricated array of the μLEDs/μdetectors of FIG. 1(a).

FIG. 1(b) is a top view of a fabricated array of the μLEDs/μdetectors 102 of FIG. 1(a). In this particular example, structures 102 are about 12 μm in diameter and p-type contacts 104 are about 8 μm in diameter.

FIGS. 2(a)–(d) are side perspectives showing examples of generic structures of several μLEDs/μdetectors 202 fabricated from various LED wafers according to various embodiments of the present invention. The LED wafers might comprise any of the LED wafers, including those made of semiconductors, polymers and organic materials. Those skilled in the art will be able to apply this structure to any type of LED wafer.

Figure 2A:
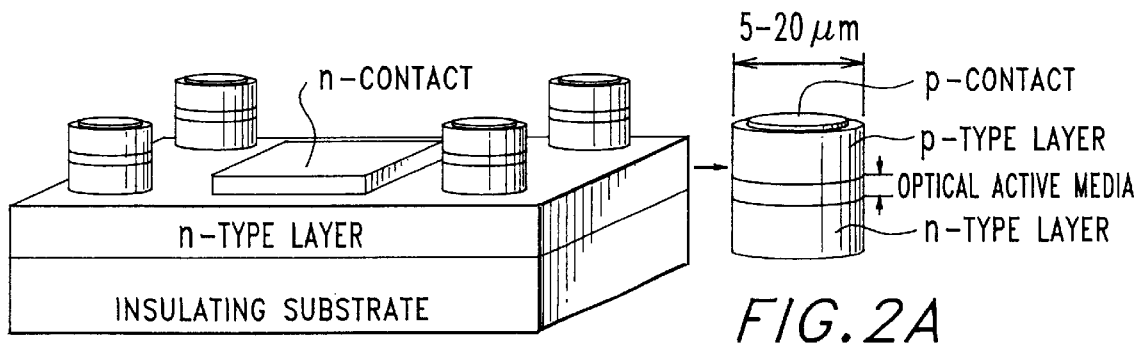
FIGS. 2(a)–(d) are side perspectives showing structures of several μLEDs/μdetectors based on generic LED wafers according to the present invention.
Figure 2B:
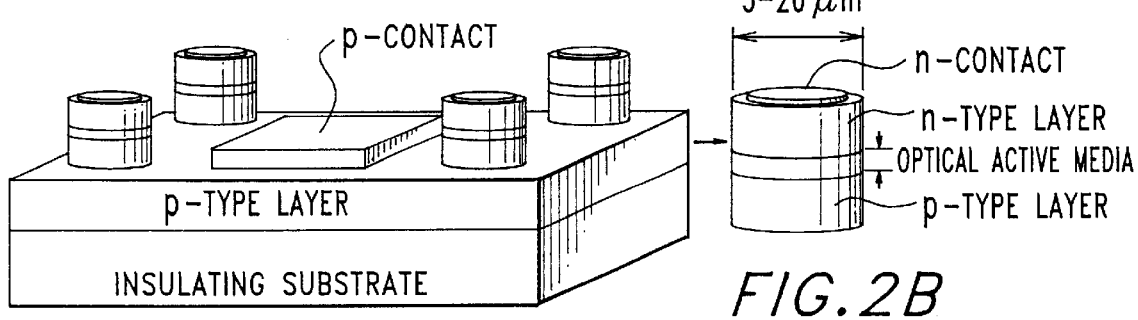
Figure 2C:
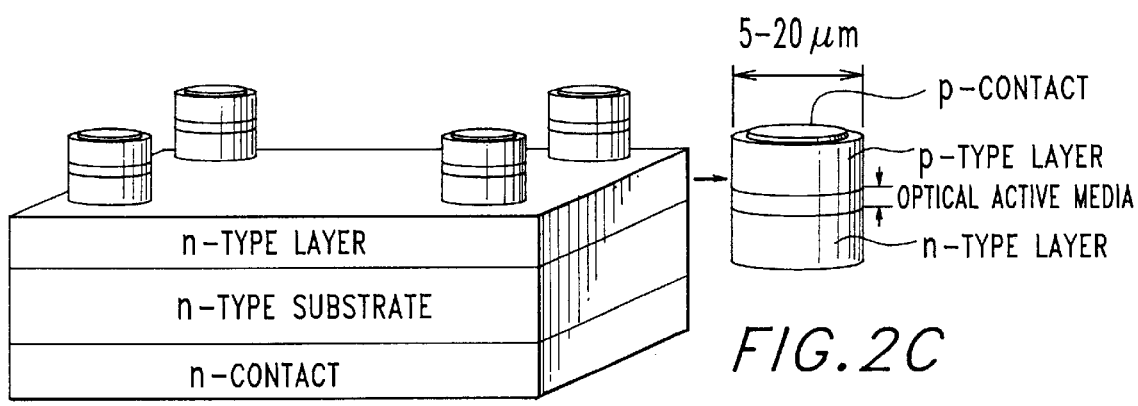
Figure 2D:
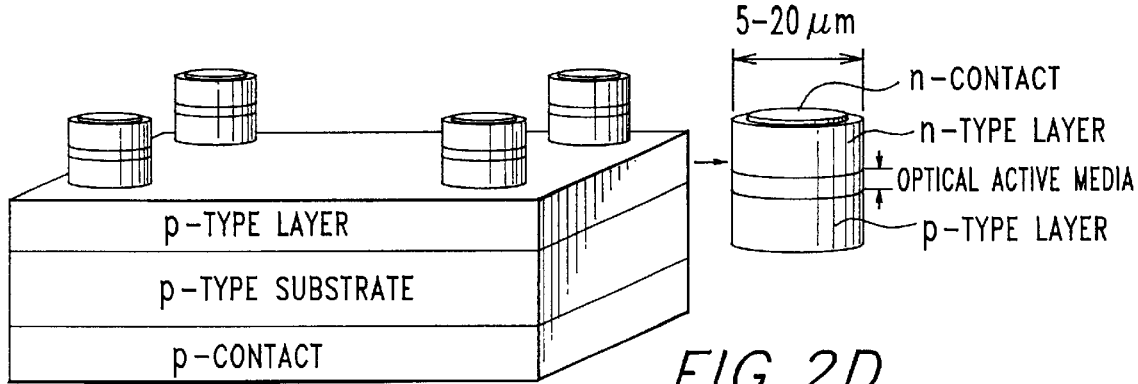

Depending on the nature of the substrate, the n-contact can be formed above the exposed underneath n-type layer when the substrate is insulating as shown in FIG. 2(a); the p-contact can be formed above the exposed underneath p-type layer when the substrate is insulating as shown in FIG. 2(b); the n-contact can be formed below the n-type substrate if the substrate is n-type as shown in FIG. 2(c); or the p-contact can be formed below the p-type substrate if the substrate is p-type as shown in FIG. 2(d).

Figure 3A:
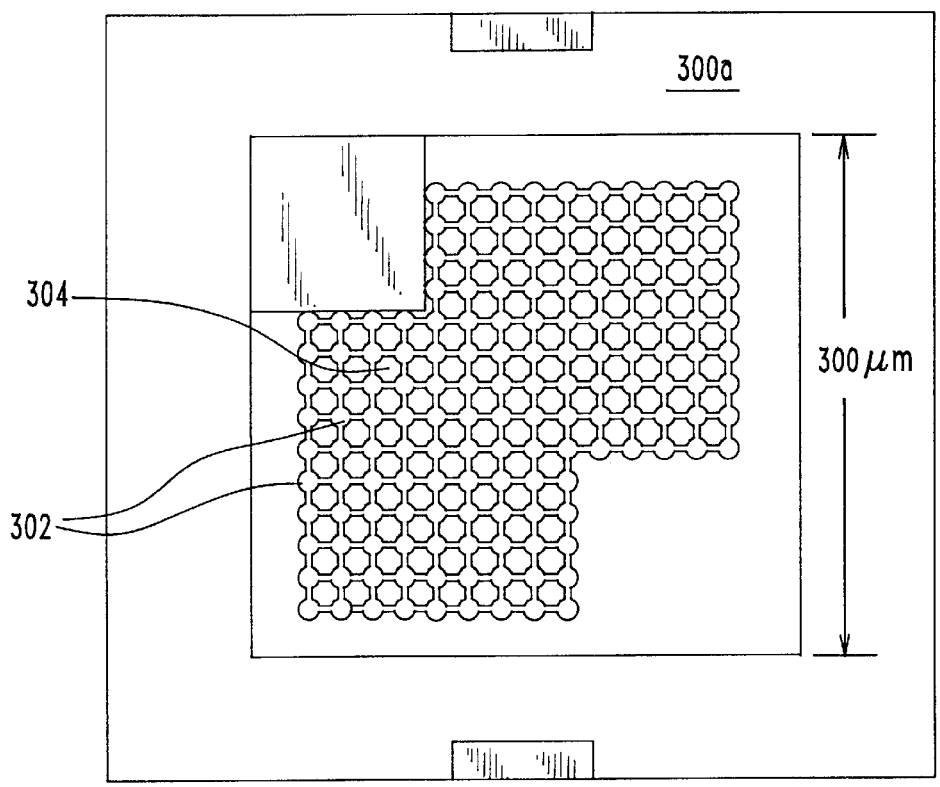
FIG. 3(a) shows a top view of one of the working mask patterns for creating a interconnected μLED/μdetector array comprising a few hundred μLEDs/μdetectors by photolithography and etching.

FIG. 3(a) shows a top view of a working mask pattern 300a. This mask is used to pattern an array comprising many of the interconnected μLEDs/μdetectors by photolithography and etching as well as for deposition of p-type Ohmic contacts 104. The shaded regions 302 are those of μLEDs/μdetectors, while the white regions 304 are etched holes between μLEDs/μdetectors. The mask shown in FIG. 3a is approximately 300 μm by 300 μm, so that many μLEDs/μdetectors fit into the same area taken up by a conventional broad area LED.

Figure 3B:
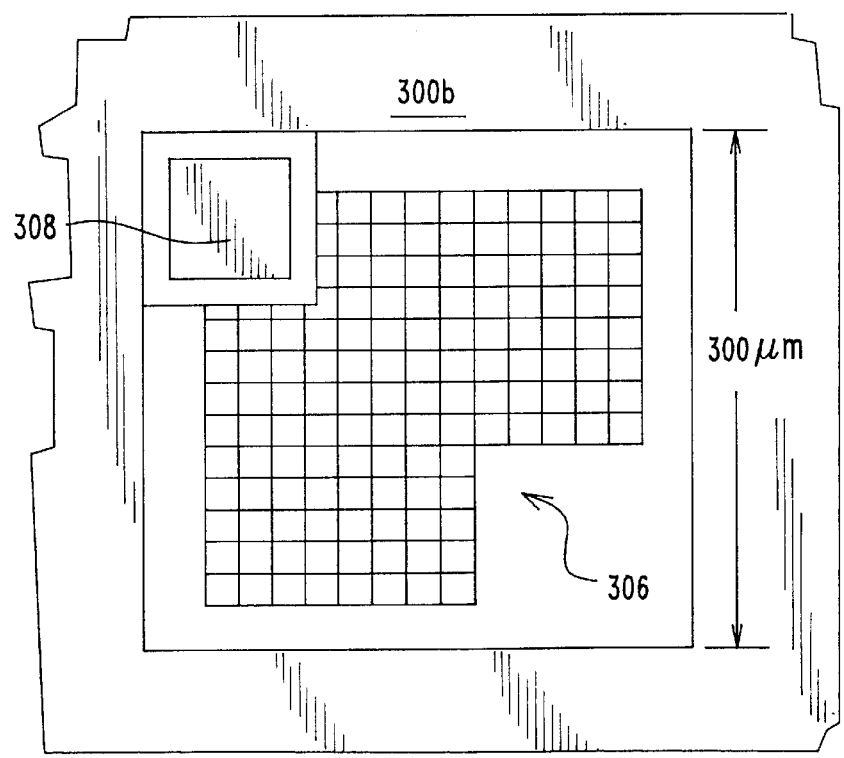
FIG. 3(b) shows a top view of a mask pattern for deposition of metallic wires that interconnect a few hundred of the μLEDs/μdetectors in a manner to permit turning all μLEDs/μdetectors on and off simultaneously.

FIG. 3b shows a top view of a second mask pattern 300b that allows the deposition of metallic wires that interconnect many of the μLEDs/μdetectors patterned by the mask 300a through the P-type Ohmic contacts 104. This array of μLEDs/μdetectors is useful for hyper-bright LEDs and lighting applications, since the efficiency of the μLED array is significantly enhanced over the conventional broad area LEDs. One of the corners 306 (of about 100×100 μm) is to allow the removal of materials above the n-type layer by etching as well as the deposition of n-type Ohmic contact 106 on the underneath exposed n-type layer 112 for current injection (this is needed for the case when the substrate is insulating such as that in FIG. 2a). The other corner (308) (of about 100×100 μm) is to allow the deposition of p-type contact pad on the top, which connects the p-type Ohmic contacts 104 for current injection.

Figure 4A:
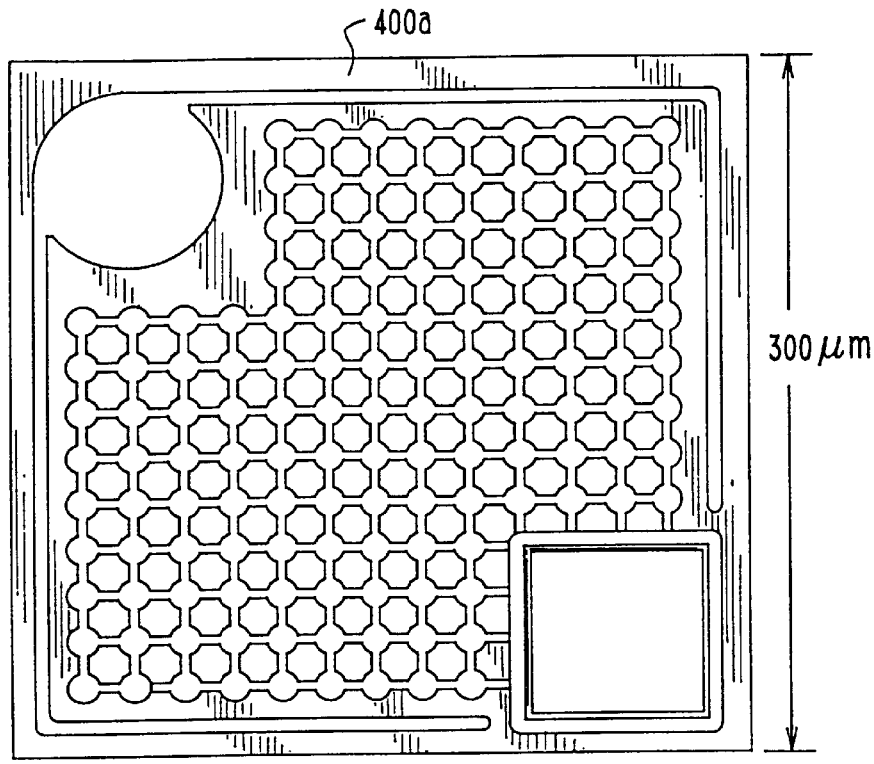
FIG. 4(a) shows the top view of a fabricated μLED array comprising a few hundred of the III-nitride μLEDs of FIG. 1 that fit into the same area as a conventional broad area LED.
Figure 4B:
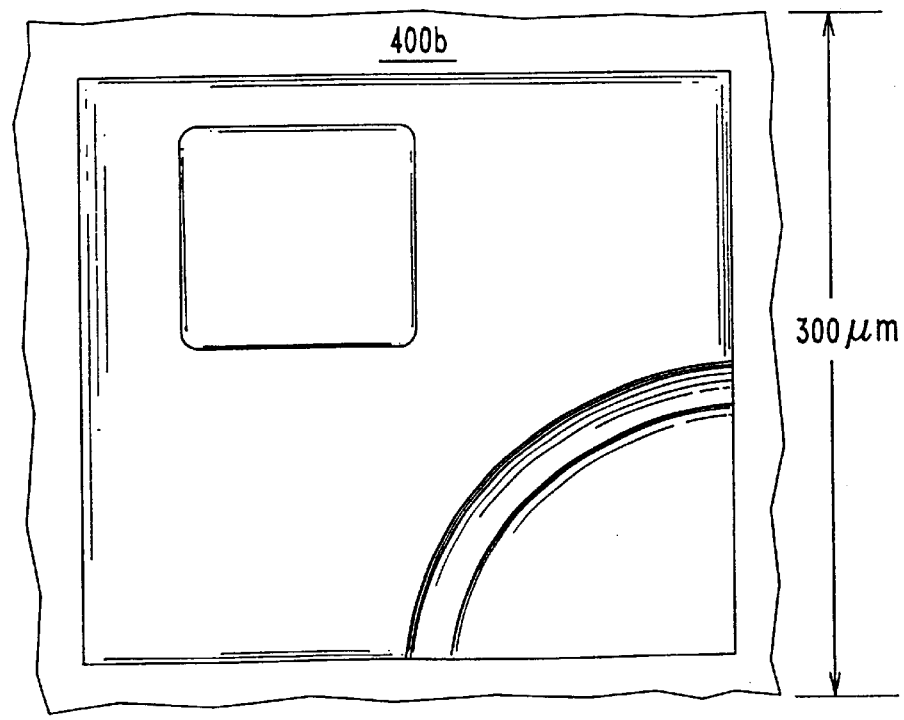
FIG. 4(b) (prior art) shows a top view of a fabricated conventional broad area III-nitride LED that has the same luminous area as the μLED array of FIG. 4(a).

FIG. 4(a) shows the top view of a fabricated array 400a comprising a plurality of the III-nitride μLEDs that fit into the same area as a conventional broad area LED according to the present invention. FIG. 4(b) (prior art) shows a top view of a fabricated conventional broad area III-nitride LED 400b that has the same area as the array of μLEDs 400a.

Figure 5:
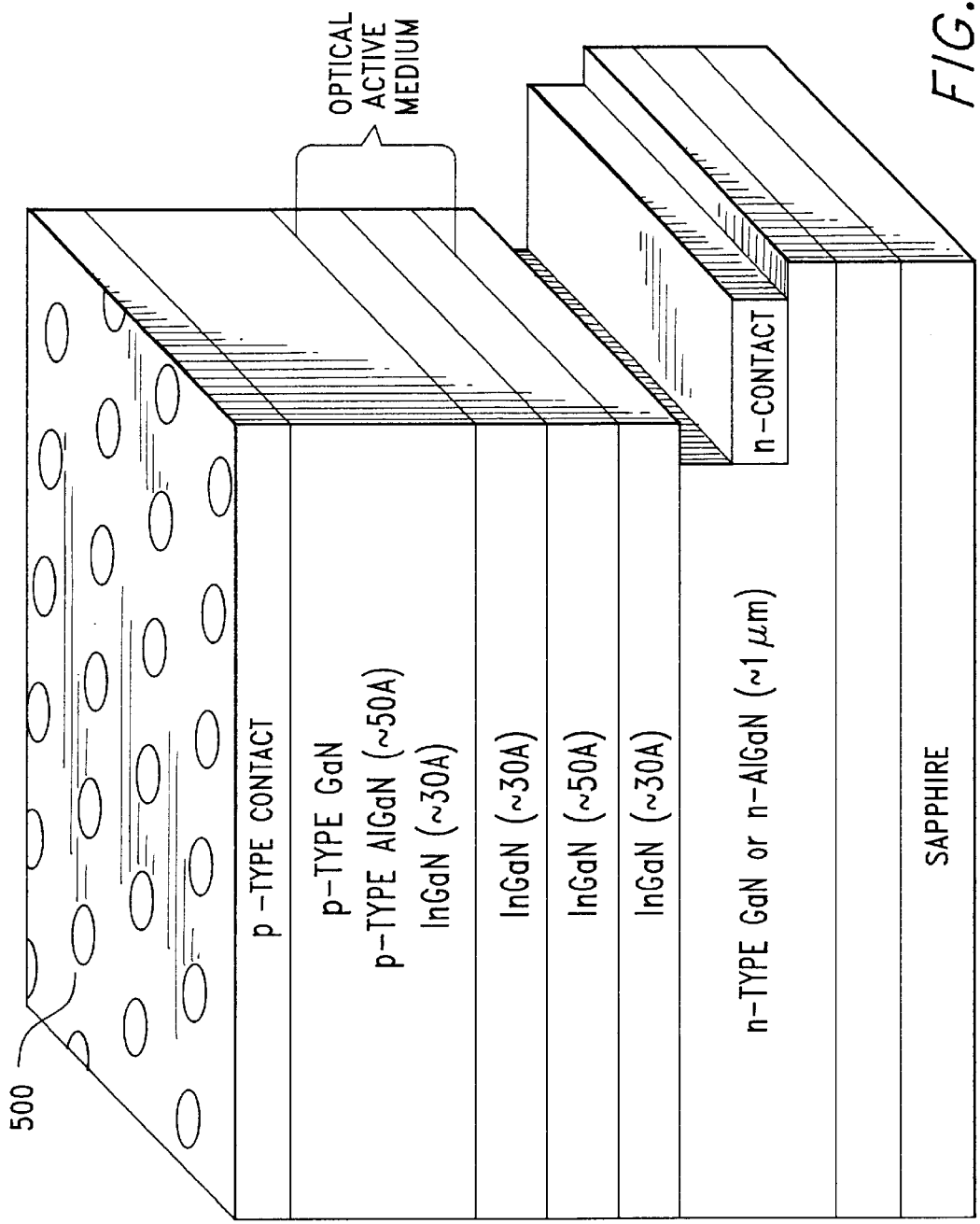
FIG. 5 is a side perspective showing one of the structures of a second embodiment of an array of inverted μLEDs based on III-nitrides according to the present invention.

FIG. 5 is a side perspective showing the structure of a μLED array comprising several inverted μLEDs 500 according to the present invention. This structure comprises a series of micro-size holes drilled into a conventional broad area LED. The holes are drilled all the way to the substrate. The array of inverted μLEDs is useful for hyper-bright LEDs and lighting applications, since the efficiency of the inverted μLED array is significantly enhanced over a conventional broad area LED. Inverted μLEDs 500 cannot be used for minidisplays, however, because they cannot be individually addressed.

Figure 6:
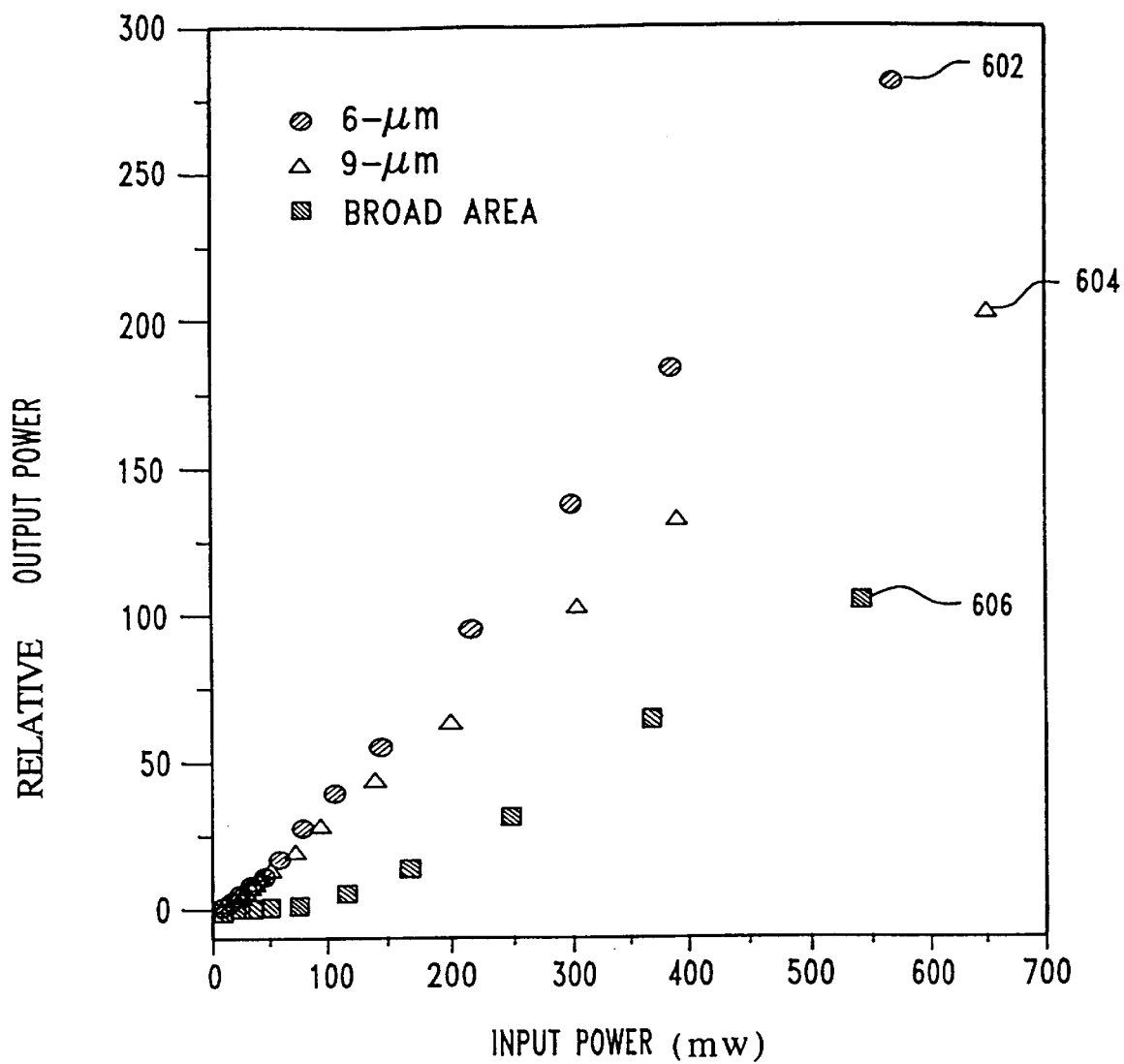
FIG. 6 is a plot showing light output power versus input power for a conventional broad area LED, for a μLED array with individual μLEDs of 6 μm in diameter, and for a μLED array with individual μLEDs of 9 μm in diameter.

FIG. 6 is a plot showing light output power versus input power for a conventional broad area LED 400b and for two μLED arrays 400a. The two μLED arrays occupy the same area as the conventional broad area LED and each comprise a few hundred μLEDs. Curve 602 shows the results for an array of 6 μm diameter μLEDs. Curve 604 shows the results for an array of 9 μm diameter μLEDs. Curve 606 shows the results for a single conventional broad area LED having the same luminous area as well as the same optical active media as the array of 6 μm diameter μLEDs of curve 602, and the array of 9 μm diameter μLEDs of curve 604. Note that significantly more light is produced by the μLED arrays over the conventional broad area LED.

Figure 7A:
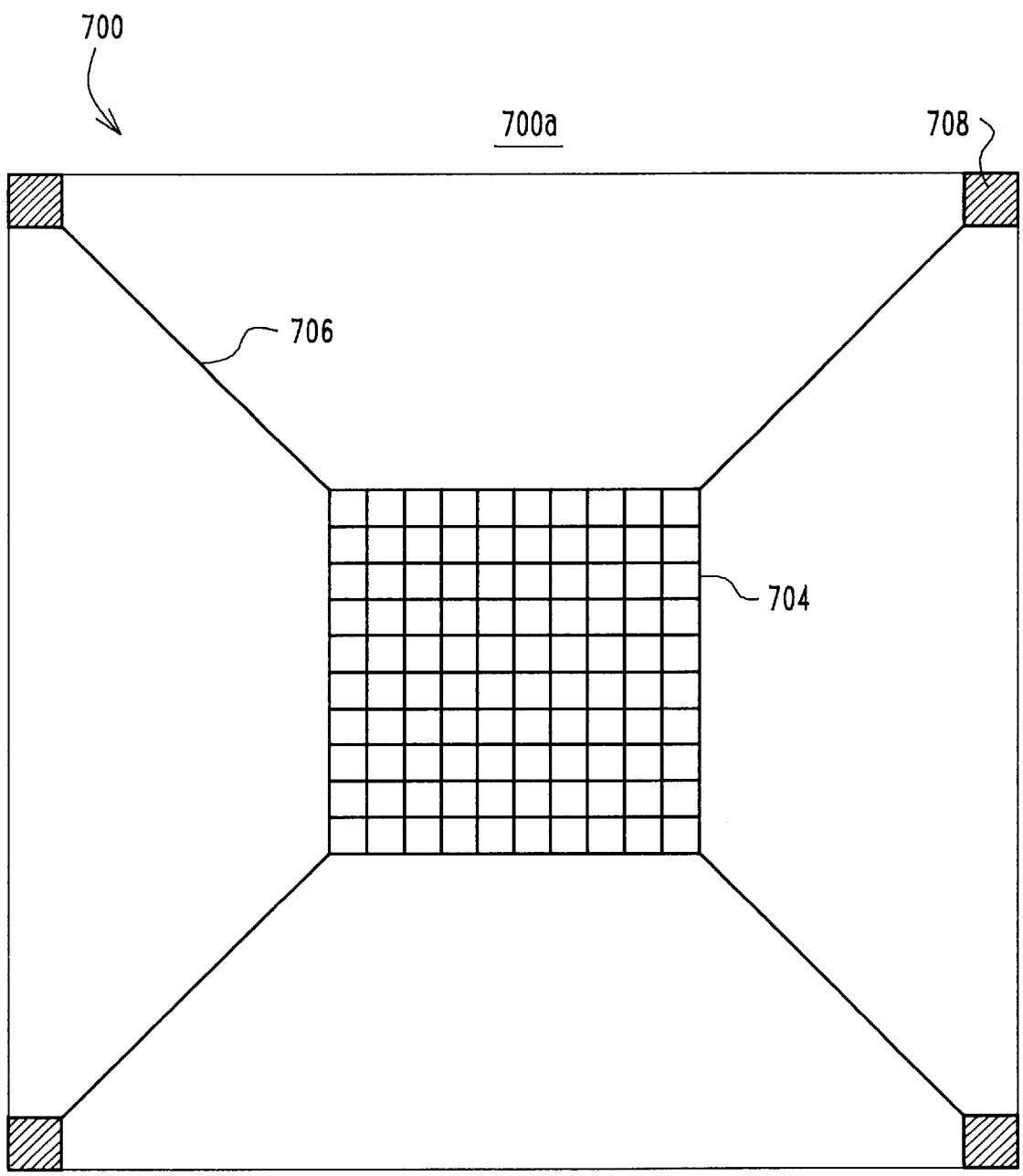
FIGS. 7a and 7b show a top view of an interconnected array comprising many of the μLEDs/μdetectors of FIG. 1a in a manner to permit turning each μLED on and off individually, or sensing the output of each μdetector separately.
Figure 7B:
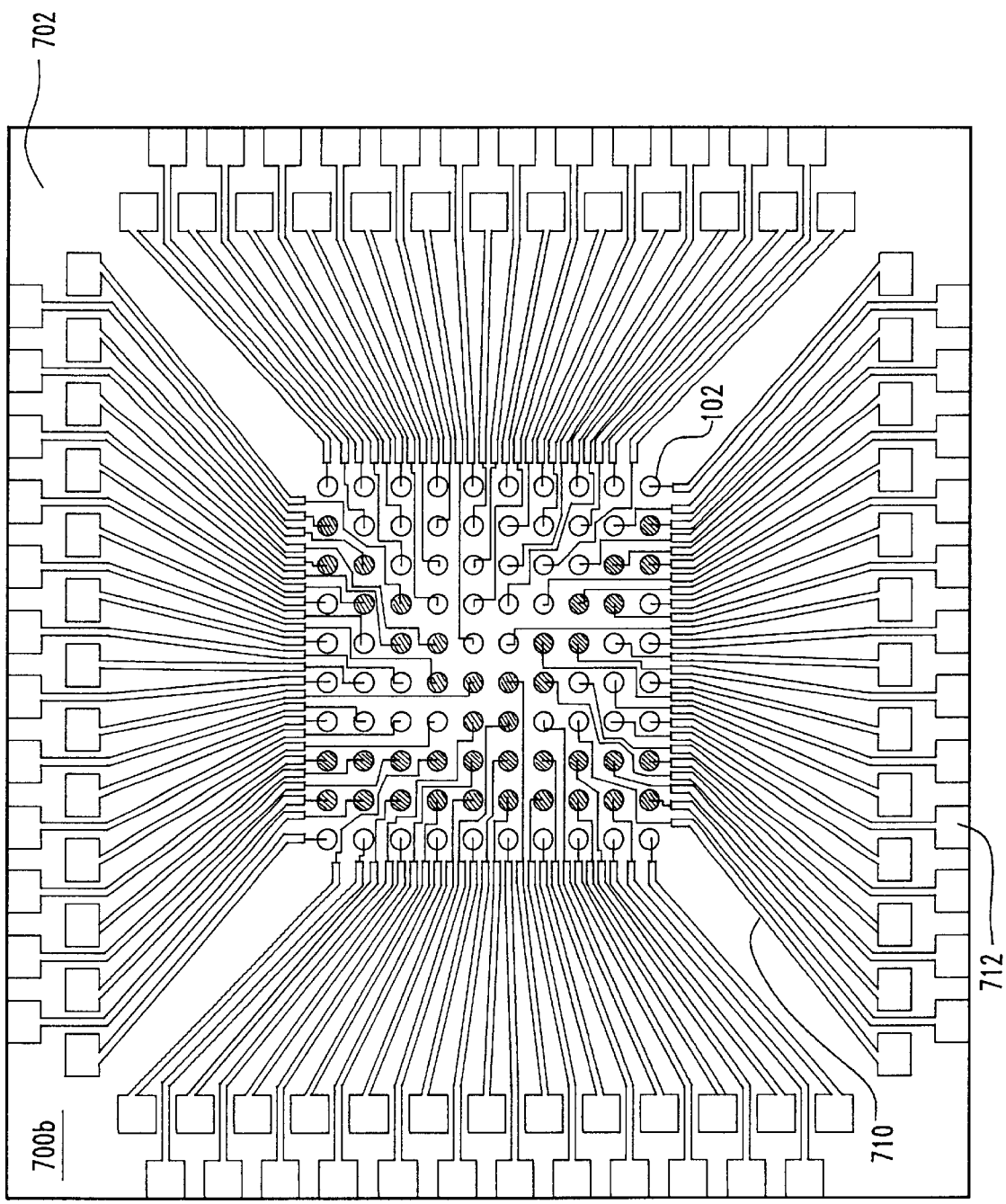
Figure 7C:
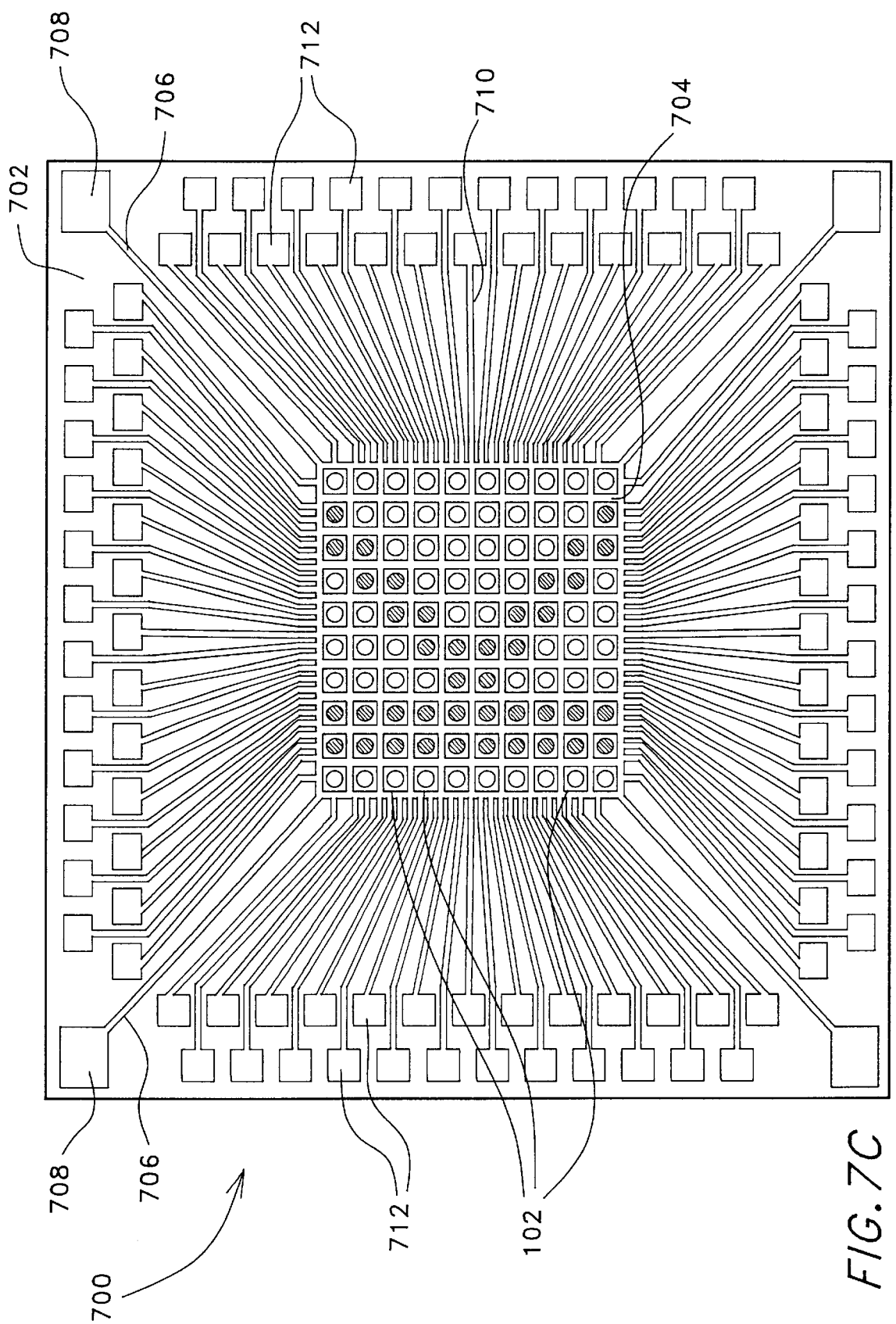
FIG. 7c shows a top view of an actual fabricated array similar to the one shown in FIGS. 7a and 7b.

FIGS. 7a and 7b show a top view of an interconnected array 700 comprising many of the μLEDs 102 of FIG. 1(a) connected in a manner to permit turning each μLED (or pixel in this case) on and off individually (in the case where the elements are forward biased) or to permit detecting light at each μdetector/pixel (in the case where the elements are reversed biased). FIG. 7a shows the n-type layer 700a of array 700, and FIG. 7b shows the p-type layer 700b and the insulating layer 702. FIG. 7c shows a top view of an actual fabricated array 700 similar to the one shown in FIGS. 7a and 7b.

Layer 702 is an insulating layer deposited above the exposed underneath n-type layer 114. Insulating layer 702 is to prevent the current leakage between the n-type and p-type layers. Grid 704 is the n-type Ohmic contact. Conducting wires 706 make the connection between the n-type Ohmic contacts 704 and the contact pads 708 which are used for current injection into n-type Ohmic contact (needed only when the substrate is insulating).

Conducting wires 710 make the connections between individual μLEDs through the p-type Ohmic contacts 104 and the μLED control pads 712 which are used for current injection into p-type Ohmic contacts. Each μLED has its own control pad. In this array, the state of the μLEDs 102 is individually controlled.

When forward biased, the n-type and p-type ohmic contact and pads are used for current injection into individual pixels. Arrays such as 700 are useful in areas such as head wearing displays, minidisplays, emitters for remote free space functions, short distance optical communication, and optical interconnects.

When reverse biased, the n-type and p-type ohmic contacts and pads are used for collecting photocurrent from individual pixels. In this case, array 700 comprises a plurality of μdetectors for detecting light. μdetector array 700 is useful for imaging sensors and detector arrays operating from visible to UV. All these devices have important applications in satellite communications, astronomical imaging, missile detection, medical imaging and minidisplays, etc.

The principles discussed above in conjunction with in FIG. 7 apply to arrays comprising many more μLEDs/μdetectors. For an array comprising a vast number of μLEDs/μdetectors (or pixels), pixels are controlled by current injection through a matrix of rows and columns of μLEDs/μdetectors. In this case, each pixel is designated by a two-integer format (i,j). The first integer i designates the row number of the matrix and the second integer j designates the column number of the matrix (equivalently, rows and columns could be interchanged). μLEDs/μdetectors in the same row are connected through the n-type underneath layer, while cross talk between different rows is precluded by employing etching isolation. (For example, for III-nitride μLED/μdetector arrays grown on a sapphire substrate, one can etch into the sapphire substrate so that no III-nitride material is present between different rows). All LEDs/μdetectors in the same column are connected through the top p-type Ohmic contacts, while cross talk between different columns is precluded by depositing an insulating layer 702. In such a manner, the state of each pixel can be individually controlled.

The array can also be bounded to an electronic readout array which is fabricated on crystalline silicon using the complimentary metal oxide semiconductor (CMOS) fabrication methods commonly employed in integrate circuit manufacturing. The CMOS readout array would provide pixel selection, signal amplification, pixel reset, etc.

While the exemplary preferred embodiments of the present invention are described herein with particularity, those skilled in the art will appreciate various changes, additions, and applications other than those specifically mentioned, which are within the spirit of this invention.

What is claimed is:

1. A micro-size optical element comprising:
   an n-contact;
   a p-contact; and
   an optical active structure connected between the n-contact and the p-contact for generating light when forward biased and for detecting light when reverse biased;
   wherein the optical active structure has diameter of about 20 μm or smaller.

2. The optical element of claim 1, wherein the optical active structure is forward biased to form a micro-size LED (μLED).

3. The optical element of claim 1, wherein the optical active structure is reverse biased to form a micro-size detector (μdetector).

4. A mini-array of optical elements comprising:
   a substrate;
   a buffer layer formed on the substrate;
   a first contact; and
   a plurality of optical active structures, each structure having a second contact, each structure connected between the first contact and that structure's second contact for generating light when forward biased and detecting light when reverse biased;
   wherein one each of the first contact and the second contact is a p-type contact and a n-type contact; and
   wherein the structures are about 20 μm or less in diameter.

5. The array of claim 4, fabricated from a III-nitride LED wafer.

6. The array of claim 4, wherein each optical active structure is individually controlled.

7. The array of claim 6, wherein the optical active structures are forward biased to form μLEDs, and wherein the array is used as a minidisplay.

8. The array of claim 6, wherein the optical active structures are reverse biased to form μdetectors, and wherein the array is used as a detector array.

9. The array of claim 4, wherein the optical active structures are reverse biased to form μdetectors, and substantially all of the μdetectors are turned on and off together.

10. The array of claim 4, wherein the optical active structures are forward biased to form μLEDs, and substantially all of the μLEDs are turned on and off together.

11. The array of claim 10, used as a hyper-bright LED.

12. A mini-array of optical elements comprising:
   an LED wafer constructed to form a plurality of micro-size holes extending into the wafer, wherein the micro-size holes are about 20 μm or less in diameter.

13. The mini-array of claim 11, wherein the LED wafer is forward biased to form a hyper-bright LED.

* * * * *

UNITED STATES PATENT AND TRADEMARK OFFICE
CERTIFICATE OF CORRECTION

PATENT NO.   : 6,410,940 B1
DATED        : June 25, 2002
INVENTOR(S)  : Hongxing Jiang et al.

It is certified that error appears in the above-identified patent and that said Letters Patent is hereby corrected as shown below:

Column 1,
Line 7, insert -- This invention was made with Government support awarded by the National Science Foundation under Grant Number DMR-9902431 and Army Research Office under Grant Number DAAH04-96-1-0371. The Government has certain rights in this invention --.

Column 2,
Line 43, delete "5".

Column 6,
Line 55, delete "11" and insert -- 12 --.

Signed and Sealed this

Fourth Day of February, 2003

JAMES E. ROGAN
*Director of the United States Patent and Trademark Office*